COMPONENTS FOR PRINTED CIRCUITS

Original Filed Dec. 12, 1961 8 Sheets-Sheet 1

JOSEF BOEHM
ADOLF L. HERRMANN
*INVENTORS*

*BY* G. W. O'Brien
Charles C. Woodward
ATTORNEYS

Sept. 7, 1965 J. BOEHM ETAL 3,205,408

COMPONENTS FOR PRINTED CIRCUITS

Original Filed Dec. 12, 1961 8 Sheets-Sheet 2

JOSEF BOEHM
ADOLF L. HERRMANN
*INVENTORS*

*BY*

ATTORNEYS

COMPONENTS FOR PRINTED CIRCUITS

Original Filed Dec. 12, 1961 8 Sheets-Sheet 3

JOSEF BOEHM
ADOLF L. HERRMANN
*INVENTORS*

BY [signatures]
ATTORNEYS

COMPONENTS FOR PRINTED CIRCUITS

Original Filed Dec. 12, 1961 8 Sheets-Sheet 4

JOSEF BOEHM
ADOLF L. HERRMANN
*INVENTORS*

BY [signature] [signature]
ATTORNEYS

JOSEF BOEHM
ADOLF L. HERRMANN
*INVENTORS*

*BY*

ATTORNEYS

COMPONENTS FOR PRINTED CIRCUITS

Original Filed Dec. 12, 1961 8 Sheets-Sheet 6

JOSEF BOEHM
ADOLF L. HERRMANN
*INVENTORS*

*BY*

ATTORNEYS

JOSEF BOEHM
ADOLF L. HERRMANN
*INVENTORS*

*BY*

ATTORNEYS

COMPONENTS FOR PRINTED CIRCUITS

Original Filed Dec. 12, 1961

JOSEF BOEHM
ADOLF L. HERRMANN
*INVENTORS*

*BY*

ATTORNEYS

United States Patent Office 3,205,408
Patented Sept. 7, 1965

3,205,408
COMPONENTS FOR PRINTED CIRCUITS

Josef Boehm, 1311 Hermitage Ave. SE., and Adolf L. Herrmann, 710 Watts Drive NE., both of Huntsville, Ala.

Continuation of application Ser. No. 158,915, Dec. 12, 1961. This application Apr. 14, 1964, Ser. No. 360,801
17 Claims. (Cl. 317—101)
(Granted under Title 35, U.S. Code (1952), sec. 266)

The invention described herein may be manufactured and used by or for the Government of the United States of America for governmental purposes without the payment of any royalties thereon or therefor.

This application is a continuation of application Serial No. 158,915, filed December 12, 1961.

This invention relates in general to means for mounting and electrically interconnecting circuit components which are susceptible to employment on an insulated panel having thereon a printed circuit, and more particularly for mounting circuit elements having significant mass, such as relays.

The use of printed circuit wiring has been extended materially in recent years in the manufacture of compact electronic devices. The components for incorporation in such printed circuitry have, for the most part, been successful. However, in the application of such circuitry to rockets, launch vehicles, missiles, satellites, etc., that is, in the utilization of such circuitry for space vehicles, the presently known components (such as relays, connectors, and circuit modules) have proven to be unsatisfactory and unreliable as well as costly, both in manufacture and in installation, adaptability and ability to withstand vibration and loads imposed thereon by vibration and/or acceleration. This has been due, in a major sense, to the manner in which such devices have been mounted.

For example, many electrical components of the prior art which were available for application in space vehicles were of the "plug-in" type similar to the ordinary vacuum tube. Examples of such components are relays of generally cylindrical, rectangular or oval configuration. Such relays have either a number of pins protruding from a base for insertion in preformed receptacles on a circuit board or a plurality of wire leads which generally must be soldered to corresponding portions of the circuit. In either case the relay must be particularly positioned, and in the former case, care must be taken that the pins are not bent or deformed on installation or during use. In addition, the receptacles for such pins must be precision formed and positioned, and if the lead is to be soldered, such operation must be painstakingly performed. This operation is, of course, both costly and time-consuming.

In addition, due to the configuration of such components as well as the relative fragility of the electrical connectors or leads, these devices are most subject to displacement and/or breakdown on the application of dynamic loads imposed thereon by acceleration, vibration, and changes in environment, conditions which are inherent in space vehicles. An additional disadvantage in such applications is that the volume occupied by these components is almost entirely on one face of the printed circuit board, thus limiting to a major degree the placement and relationship of the panels with respect to other structures or components of the vehicle.

According to the present invention, the foregoing and other disadvantages are obviated by providing an electric circuit component which is adapted to be incorporated in a printed circuit, the component consisting essentially of a body having thereon flanges or flange-like portions which function to attach the body to a circuit panel and/or make electrical contact. In one preferred embodiment of the invention, the component is positioned in a recess in a printed circuit board in order to locate the center of gravity of the component as close as possible to the plane of the board. This embodiment serves to reduce the susceptibility of the component to dynamic loads imposed on it, as well as to occupy a minimum of space in a direction at right angles to the plane of the board. In another embodiment, the component body is mounted only on one side or face of the board in order that the reverse side of the board is clear of obstruction.

The body is preferably formed with integral positioning and orienting means and contact surfaces are terminated in one plane surface or a plurality of co-planar plane surfaces for ease of installation and manufacture, these surfaces having conductor contact means therein. The contact means employed are self-wiping at installation, are dirt and dustproof in operation and increase component reliability by obviating the necessity of soldering, aligning ends, etc. The component herein disclosed has particular application and utility in space vehicles due to its comparatively small size, ruggedness, ease of incorporation, manufacture, and insensitivity to dynamic loads, but the inventive concept is, of course, applicable to any electrical component or any environment where such characteristics are desirable.

Other objects and many attendant advantages of the present invention will be apparent from the following detailed description when taken together with the accompanying drawings in which.

Figure 1:
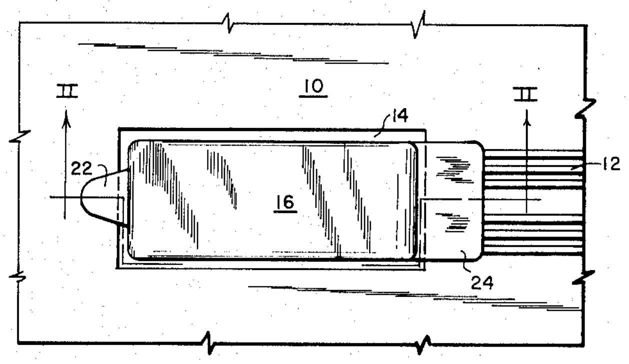
FIGURE 1 is a plan view of the device of this invention incorporated in a printed circuit board.
Figure 2:
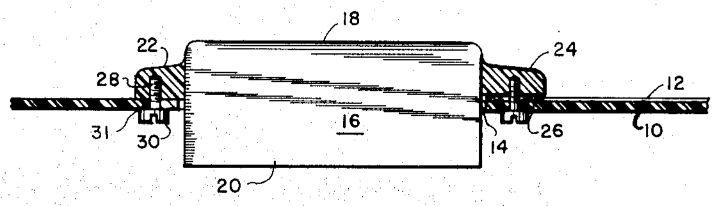
FIGURE 2 is a side view partially in section, of the device of FIGURE 1 taken on the line II—II thereof.

In the embodiment of the invention as exemplified in FIGURES 1 and 2, a printed circuit board 10 having electrically conductive elements 12 thereon is provided with a cutout or recess 14 in the body of the board. An electrical component 16 having an upper portion 18 and a lower portion 20 (see FIGURE 2) is provided with mounting flange 22 and a mounting-contact flange 24 symmetrically arranged on the component body. All of the electrical connecting elements of the device, for contact with the conductors 12 of the printed circuit board 10, terminate in one plane surface 26. In this embodiment, the contact flange 24 functions also as a mounting flange, and like mounting flange 22 has provision therein, such as recess 28, for reception of screw 30 or equivalent means from board 10, the board having a recess 31 therein for screw 30.

Figure 3:
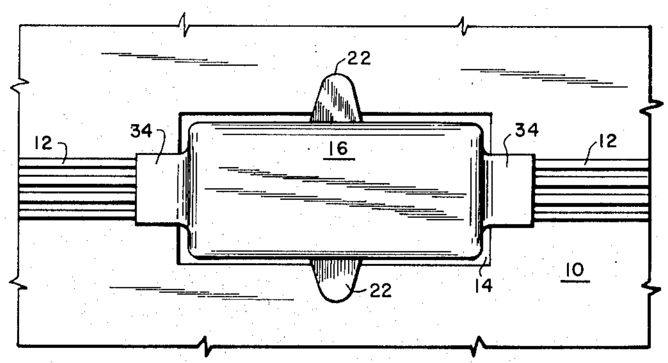
FIGURE 3 is a plan view showing a modification of the device of FIGURE 1.

FIGURE 3 shows a modification of the component of FIGURE 1 wherein, as in FIGURE 1, circuit board 10 has rectangular cutout 14 therein and printed conductors 12 on one face. Component body 16 is positioned in cutout 14. This modification differs from that previously described in that mounting flanges 22 are positioned on the longitudinal sides of the body 16. Obviously such mounting flanges have fastener receiving means therein as described in reference to FIGURE 2. Flanges 34 on the ends of the body 16 serve solely as electrical contact means with printed circuit board conductors 12, as more fully set forth hereinafter.

Figure 4:
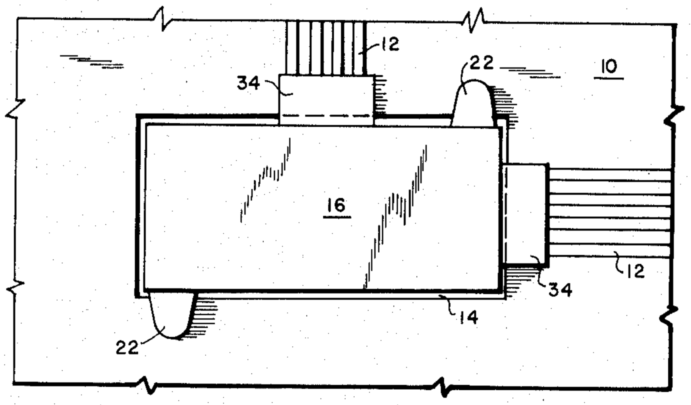
FIGURE 4 is a further modification of the component shown in FIGURE 1.
Figure 5:
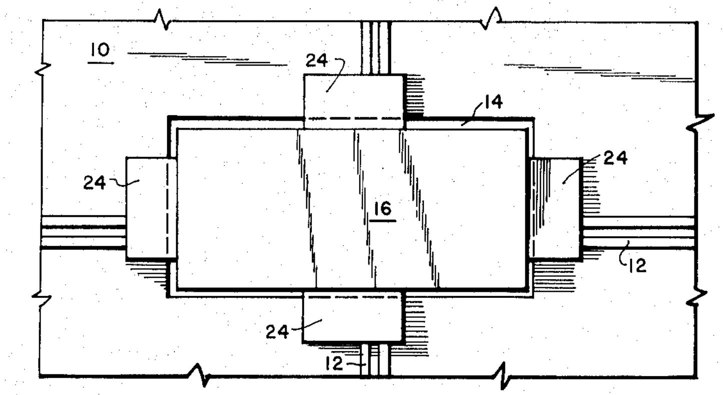
FIGURES 5 and 6 are additional modifications of the component configuration.
Figure 6:
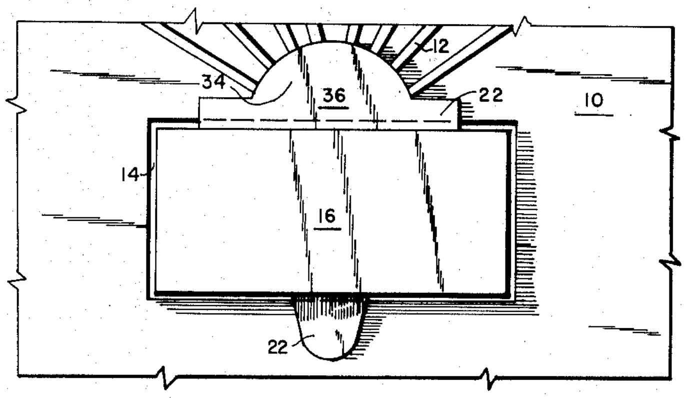

FIGURES 4–6 are illustrative of other arrangements for particular circuitry orientation. As shown in FIGURE 4, body 16 is again recessed within the cutout 14 in circuit board 10. The electrical conductors 12, in this instance, are at substantially right angles to one another, terminating of course at the cutout 14. Body 16 is provided with a pair of mounting flanges 22, one on each longitudinal side of body member 16 and positioned substantially adjacent the ends. Contact flanges 34 are positioned on one longitudinal side and one end so that they correspond to the terminal portions of the conductors 12. The flanges 34 in this modification perform only the contact function, while the flanges 22 perform only the securing function.

In FIGURE 5, conductor elements 12 are symmetrically arranged on circuit board 10 and terminate at cutout 14. The conductors 12 are arranged in a cruciform and terminate at cutout 14. Flanges 24 are symmetrically positioned with respect to body 16 and perform both the mounting and contacting functions.

FIGURE 6 is illustrative of a preferred form when the conductor elements 12 are asymmetrical to the cutout 14 and are spread over a relatively large section of the board 10 at the point of interconnection. In this instance, mounting-contact flange 36 is formed by a contact flange 34 which extends outwardly from mounting flange 22 and is formed in a half-oval configuration to permit mounting and contact with the greatest facility. Flange 36 is preferably formed integrally. A single mounting flange 22 is provided on the side opposite from mounting-contact flange 36 and is substantially centered thereon.

It is obvious that in the above described embodiments, the center of gravity of the component lies essentially in the plane of the circuit board, thus making it much more stable than conventional elongated components positioned thereon and, thus more susceptible to employment in flight vehicles. For purposes of clarity and simplicity, the foregoing embodiments have been restricted to mere configuration. The contact means described hereinafter are, of course, susceptible to employment in all of the foregoing configurations, and are in fact a salient feature in the practice of the invention. As noted, the proximity of the center of gravity of the component body, in the above described embodiments, to the plane of the printed circuit board minimizes detrimental effects of high dynamic loads.

FIGURES 7–11 are illustrative of the contact flanges previously described generally, and denominated 24, 34, and 36. Again, for the sake of simplicity, the contact means and flange therefor will be illustrated only as a purely contacting flange such as 34 of FIGURE 3.

Figures 7, 8:
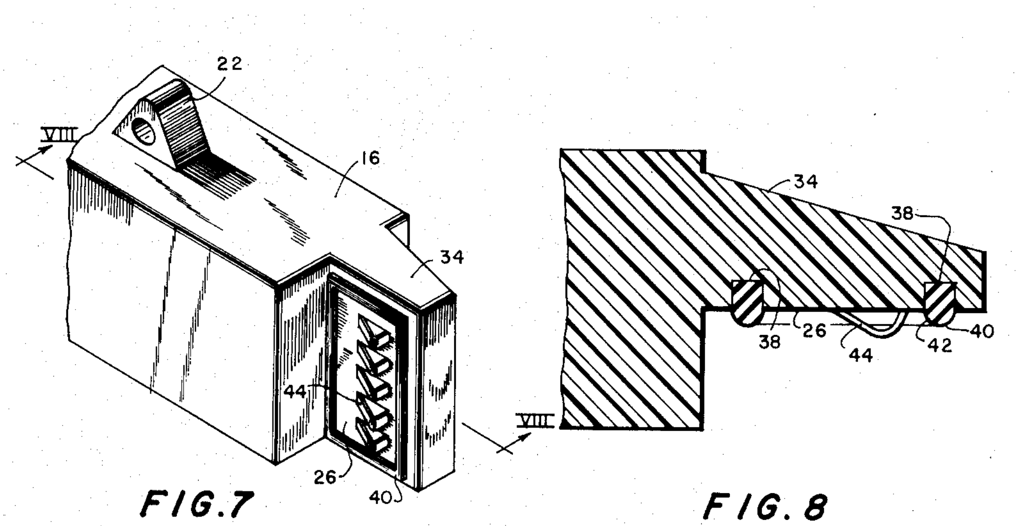
FIGURE 7 is a partial perspective view of the component of FIGURE 3 from underneath, showing a specific contact flange.
FIGURE 8 is a partial sectional view of the component corresponding substantially to the portion thereof shown in FIGURE 7.

As best seen in FIGURES 7 and 8, flange 34 is provided with both a sealing and contact means. The sealing means comprises a seal groove 38 formed generally around the periphery of the contact flange 34, the groove having an elastic seal ring 40 resiliently and compressibly held therein so that a portion of the ring projects below the plane 26 of the flange as indicated by surface 42 of FIGURE 8. It is obvious that when the component is applied to the circuit board and mechanically secured thereto, as by mounting flange 22 illustrated in FIGURE 7, the resilient seal ring 40 is compressed by the force exerted, thus providing a seal around the contact area and across printed circuit conductors 12 so as to isolate the contact means 44 from the surrounding environment. This construction aids in excluding dust, dirt, and moisture from the contact area and the interior of the component.

Figure 9:
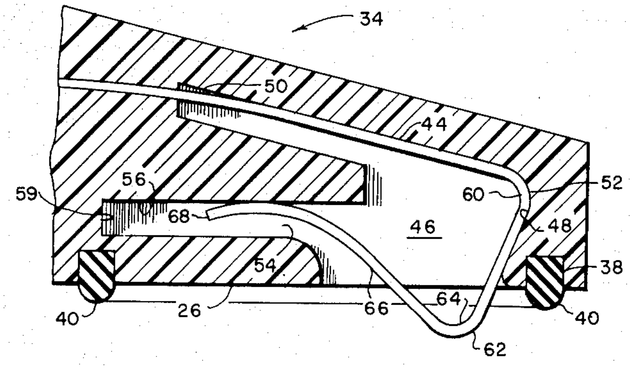
FIGURES 9, 10 and 11 are details of contact springs showing the spring wiping action.
Figure 10:
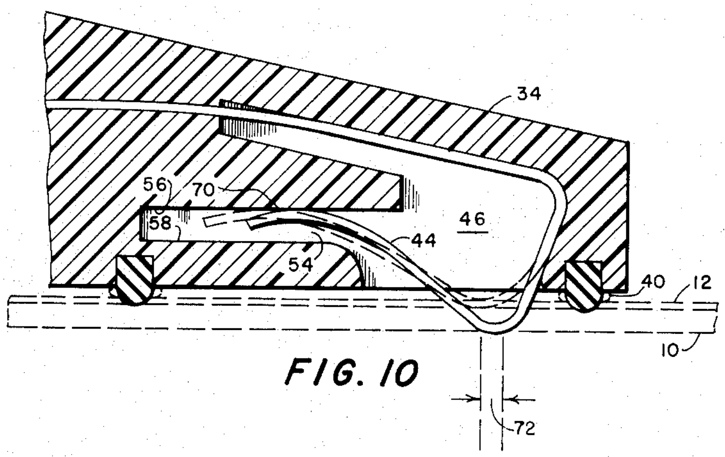
Figure 11:
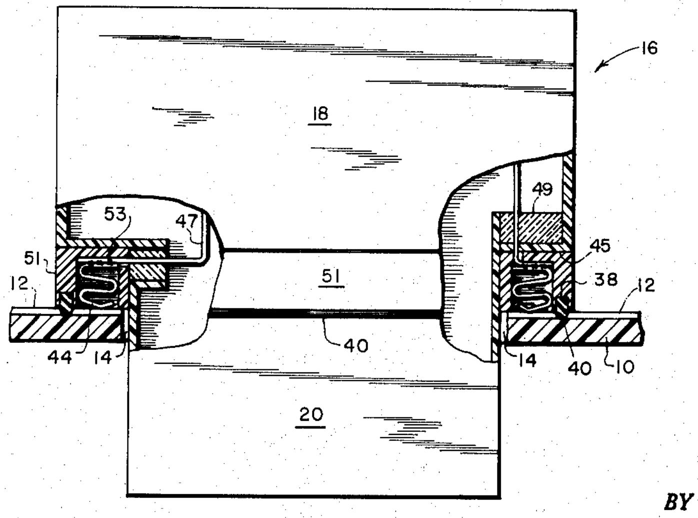
Figure 12:
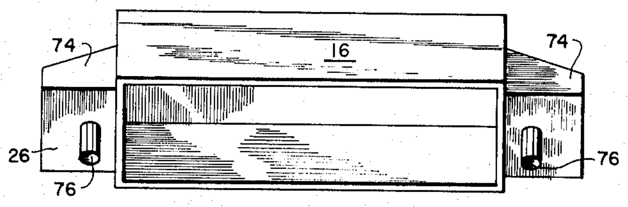
FIGURES 12–19 are illustrative of various ways in which the component of the invention may be mated to the panel.

Contact flange 34 (or mounting contact flanges 24, 36, as the case may be) has conductor contact means 44 extending therefrom, as generally indicated in FIGURES 7 and 8, and more particularly seen in FIGURES 9, 10, and 11.

FIGURES 9 and 10 are illustrative of one form of such means. As exemplified therein, flange 34 is provided with a major recess 46 formed by side walls (not shown) and end wall 48 extending upwardly and outwardly from planer face 26, and a wall 50 extending in a longitudinal direction and joining wall 48 in an acute angle 52 at the upper, outermost portion of the major recess. A minor or secondary recess 54 defined by an upper wall 56 and a lower wall 58, and wall 59, and side walls (not shown) extends inwardly from the major recess 46 in spaced relation to the planar face 26. Contact spring 44 extends from the body of the component through a header (not shown) and outwardly through flange 34 and along the recess wall 50, then downwardly and inwardly at a first acute angle 60 following the acute angle 52 of walls 48, 50. Contact spring 44 then extends downwardly and protrudes below the planar flange face 26 as best seen at point 62 of FIGURE 9. Spring 44 is then directed inwardly and upwardly at angle 64, and continues inwardly in a slight curve 66 into the minor recess 54, extending only part way therein, and terminates in end 68. It should be noted that there is a sliding surface 70 between the upper surface end 68 of spring 44 and the upper wall 56 of minor recess 54, thus permitting contact spring 44 to "give" or deform, as shown in phantom line in FIGURE 10, on the application of a securing or downward force. This deformation causes a "wiping" action between contact spring 44 and conductor elements 12 on board 10 through wiping path 72, illustrated in FIGURE 10, which action assures a good electrical contact without recourse to soldering and at the same time provides for ease of assembly and disassembly.

FIGURE 11 is a view, partially broken away and in section, of another form of contact means. As in the previous embodiments, circuit board 10 is provided with conductor elements 12 terminating at cutout 14, and component 16 is recessed therein so that upper portion 18 extends above board 10 and lower portion 20 extends below board 10. Here body 16 is formed at approximately its midportion with a flange 45 through which extends an internal conductor element 47, the latter extending through glass seal 49. On flange portion 45 is positioned base member 51 which contains, interiorly thereof, a meander-shaped contact spring 44, and has on the bottom thereof a peripheral groove 38 within which is positioned resilient sealing member 40. Conductor 47 and contact spring 44 are joined together at 53, as by soldering. Obviously, securing means such as screw 30 (illustrated in FIGURE 2) may be utilized to secure the element 16 on the board, provision being made in the base member 51 and board 10 for reception and passage of such securing means. It is apparent that spring 44 achieves a wiping action on conductors 12 as previously elaborated, the construction additionally permitting component body 16 and base member 51 to be separately fabricated and then joined. Obviously the construction also achieves the results of the components previously enumerated.

Figure 13:
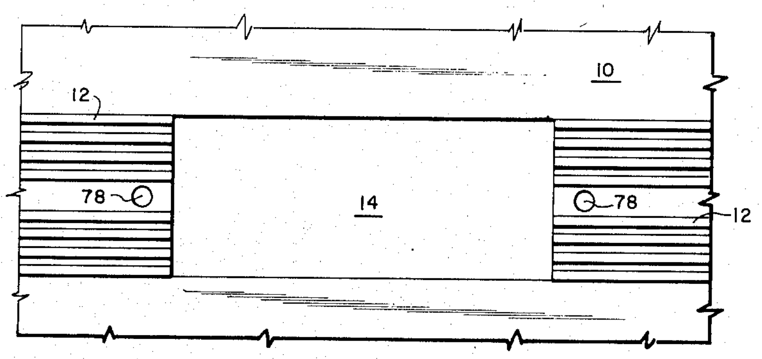
Figure 14:
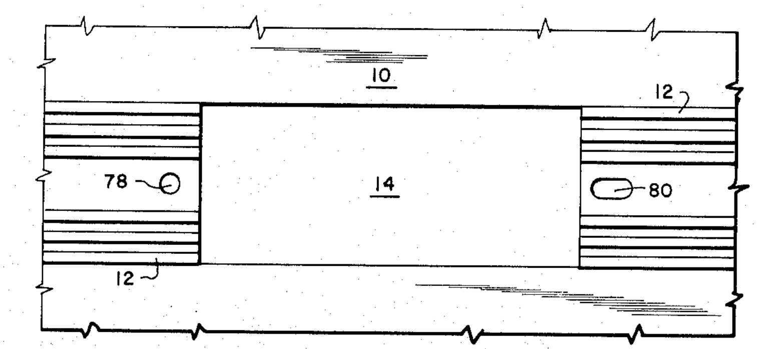

FIGURES 12–19 are illustrative of some of the many preferred ways in which the device of the invention can be oriented in a particular manner, and/or secured to the circuit board 10. Thus in FIGURE 12 there is shown a component 16 having flanges 74 on the end of the body. It is, of course, obvious that this flange could be any of the mounting flanges, mounting-contact flanges, or contact flanges previously described, as in FIGURES 1–3 and 7–11, but is here designated as flange 74 for purposes of simplicity and clarity, contact springs and seal means being omitted. Flanges 74 are provided with guide pins 76 attached to, or formed integrally with, the bottom of the flange and projecting below the planar surface 26 of the flange a distance generally equal to or greater than the thickness of the circuit board. The board 10, shown in FIGURE 13, is provided with positioning recesses 78 adjacent cut out 14 which receives the guide pins 76 to accurately position the component prior to securement. It is obvious that either or both of the positioning recesses 78 and mounting pins 76 could be elongated as illustrated by the recess 80 in FIGURE 14. These pins 76 and mating recesses 78 and/or 80 are employed to position body 16 in a particular attitude or orientation with the circuit board 10 and the particular electrical conductor elements 12 for which contact is desired.

Figure 15:
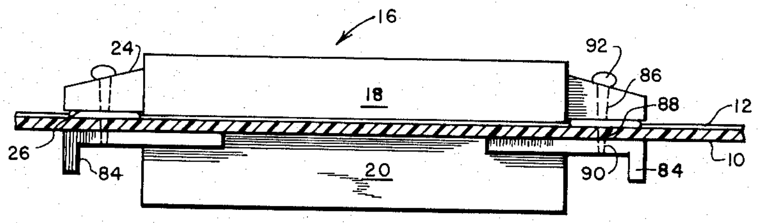
Figure 16:
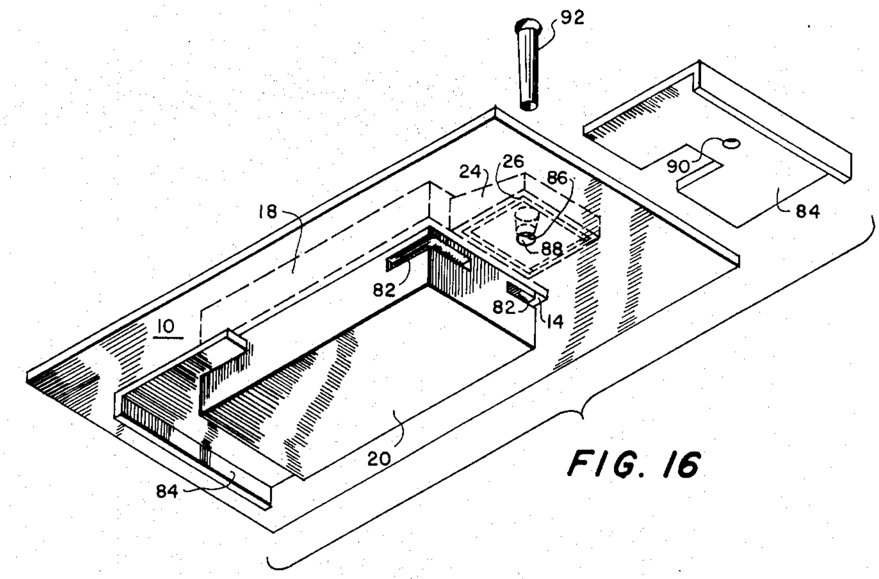

FIGURES 15 and 16 are illustrative of further modification wherein FIGURE 15 is a side elevational view and FIGURE 16 is a perspective view from below, of the component employing this modification. Here, circuit board 10 has electrical conductors 12 thereon and body or component 16 has an upper portion 18 and lower portion 20, with the mounting-contact flanges 24 having a planar face 26. Contact springs have not been shown for purposes of simplicity. The lower portion 20 of the body 16 has recesses or keyways 82 cut therein (best seen in FIGURE 16) so that they are spaced below the planar flange face 26 a distance substantially the thickness of the circuit board 10. Keys 84 are then positioned in the recesses 82 to hold body 16 in its position in the board 10. A locking recess 86 extends through flange 24 and is aligned with recess 88 in board 10 and recess 90 in key 84, and receives locking pin 92 to thus lock the parts in position and prevent accidental removal or displacement of key 84.

Figure 17:
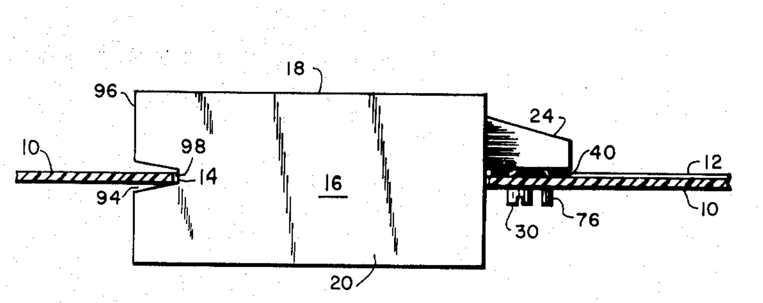

In FIGURE 17, a component body 16 having upper and lower portions 18, 20, respectively, has a recessed portion 94 along one side 96 into which one edge 98 of the cutout 14 of board 10 fits, the other side being secured by a screw 30, rivet, etc., and/or positioning pin 76 through flange 24. Obviously the recessed portion 94 could be employed only where no electrical contact with conductors 12 is required on that particular side. It is evident that the securing and positioning means shown are not exhaustive of all the ways in which the component of the invention can be positioned or secured, but are merely illustrative of the present preferred means.

Figure 18:
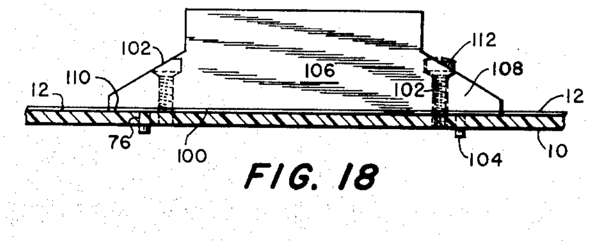
Figure 19:
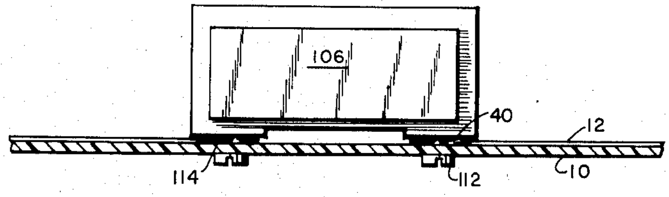

In another embodiment of the invention as shown in FIGURES 18 and 19, a component body 106 is positioned only on one face of board 10. Such an arrangement would be utilized where it is desirable to have one face of the board substantially free of obstruction, or where it is important to save space or minimize protrusions on one face of the board, or it can be utilized where dynamic loads will act only in a direction normal to, and from above, the board. The device of FIGURE 18 therefore comprises body 106 having mounting-contact flanges 108 on the ends thereof, and guide pins 104 integral with flanges 108. In this instance the flange portions 108 are formed on one side of the center plane of the body with the face 110 of the flange in co-planar relationship with bottom face 100 of the component. Fastening means 112 are inserted into recess 102 from above the flange, that is through the flange into the board, where access to the reverse face of the board is inexpedient.

In the modification illustrated in FIGURE 19, a component 106 is formed without external flanges but has planar surfaces 114 on at least one edge of the body, the body being positioned on one face of the board 10 and having suitable fastener receiving means formed integrally therewith for reception of fasteners 112, such as screws. Obviously the fastening elements could be inserted through the edges of the body from above, provision being made in the circuit board 10 for locking or holding these fastener means. It is therefore seen that the planar surface 114 on the peripheral edges of body 106 serves as both a mounting surface and an electrical contact surface. In the last two modifications described above, the center of gravity of the component is obviously no longer in such close proximity to the plane of the circuit board as was the case in the other devices. Therefore, some of the resistance to dynamic load is lost. However, the other attendant advantages of the construction as set forth previously are retained.

Figure 20:
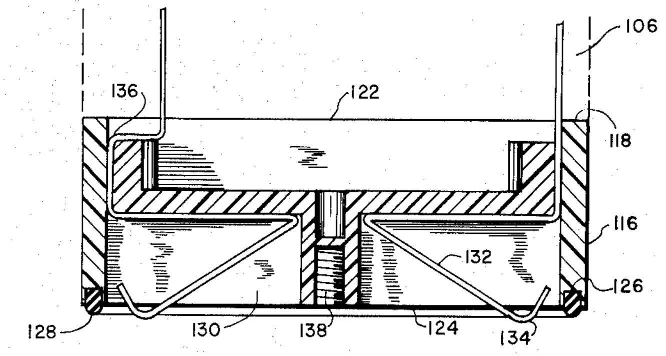
FIGURES 20, 21 and 22 illustrate details of contact springs which may be employed with a component such as shown in FIGURES 18 and 19.
Figure 21:
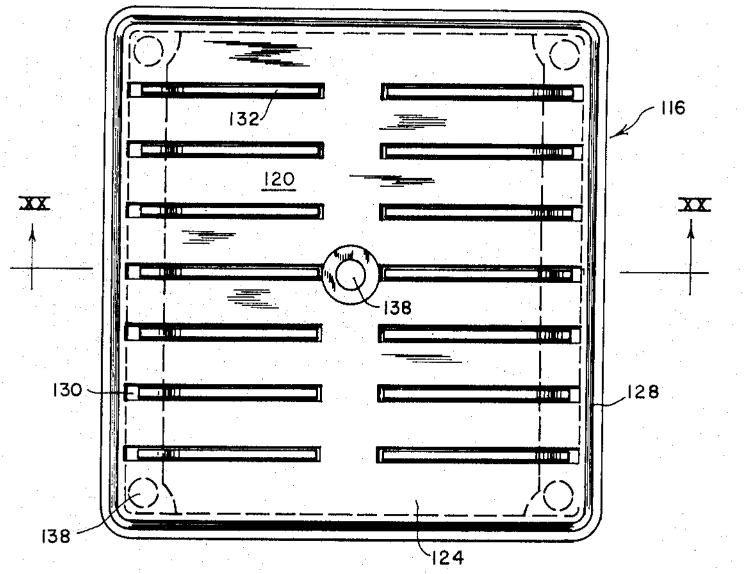

FIGURES 20 and 21 are illustrative of contact means which are particularly suitable for top mounted components such as that shown in FIGURE 19. FIGURES 20 and 21 show one such conductor contact means wherein base 116 is secured at 118 to component body 106 (shown in phantom line). Base 116 comprises a rectangular member 120, formed so as to conform to body member 106, having a mating surface 122 at the top and a board mounting surface 124 on the bottom. Seal groove 126 extends around the periphery of surface 124 (as best seen in FIGURE 21) and has seal gasket 128 resiliently held therein. Recesses 130 extend from surface 124 inwardly for reception of contact spring 132. In the unmounted position, spring 132 extends beyond the mounting face 124 as at 134 (FIGURE 20) so that when the component is secured to the board, spring 132 will deform outwardly and upwardly to achieve a wiping action on the conductor elements as explained in detail in reference to FIGURES 9–11. Spring 132 extends upwardly through the top 136 of base member 116 and inwardly into component body 106. Recesses 138 are provided in the base for reception of securing screws (not shown) to lock the component to a circuit board.

Figure 22:
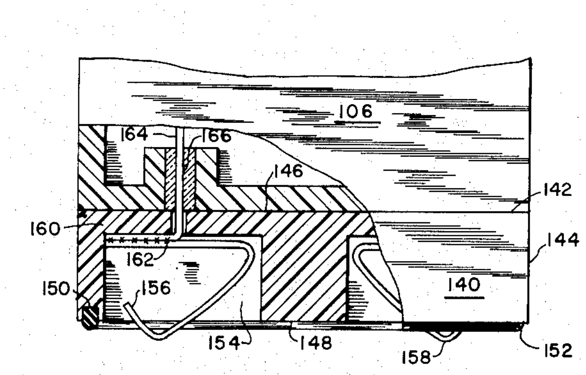

FIGURE 22 shows another modification which comprises a base member 140 attached to body 106 as at 142. Base 140 comprises a rectangular mounting element 144 having a mating surface 146 at the top and a mounting surface 148 on the bottom. Seal groove 150 extends around the periphery of base 140 and has seal gasket 152 resiliently held therein. Recess 154 extends upwardly from face 148 for reception of contact spring 156. Prior to mounting, spring 156 protrudes beyond face 148, as best seen at 158, in order to achieve the wiping action previously described. Adjacent upper face 160, spring 156 is soldered, as at 162 to conductor 164 which extends through upper face 160 and through glass seal 166 into body member 106. Securing means (not shown) such as screws, are inserted into base 140 through the circuit board in order to lock the component to the board.

Obviously many modifications and variations of the present invention are possible in light of the above teachings. A component for incorporation in a printed circuit panel board has been disclosed which, in one form, places the center of gravity of the component substantially on the plane of the printed circuit board, thereby minimizing the effect of applied dynamic loads. In a modified embodiment, the connector is positioned only on one face of the printed circuit board, thereby leaving the reverse face of the board unobstructed. In both cases, a rugged and easily installed contact means has been provided. In addition, the necessity of soldering a plurality of small connections, with the consequent time loss thereof, cost, special facilities and equipment and highly skilled labor is obviated. The component of the present invention can be readily incorporated or changed in the field by a minimum number of technicians with "standard" tools. It is, therefore, to be understood that within the scope of the appended claims the invention may be practiced other than as specifically described.

What is claimed is:

1. An electrically insulating panel board having
(A) a recess interiorly thereof,
(B) a plurality of conductive elements disposed thereon,
(C) said conductive elements terminating adjacent said recess,
(D) a conductor connecting device within said recess and positioned with its center of gravity substantially in the plane of said panel to thereby minimize the detrimental effect of applied dynamic loads, (1) said connecting device having flanges on at least two sides thereof, (a) said flanges having planar faces which faces lie substantially in a plane passing longitudinally through the component center of gravity, (b) at least one of said flanges being secured to said panel and (c) at least one of said flanges having conductor contact means on the planar portion thereof.

2. A component for incorporation with a printed circuit board, which board has a recess interiorly thereof comprising:

(A) an electrical component having (1) a body portion and (2) a plurality of discontinuous flanges, each having a planar face, on the periphery of said body portion, (3) said planar faces lying in a plane which passes longitudinally through substantially the center of the body, (4) means for electrically connecting conductors in the printed circuit, (5) said means terminating at selected ones of said planar faces and (6) some of said flange portions having means therewith for operative cooperation with a separable securing means.

3. The component as set forth in claim 2 wherein (A) at least one of said flange portions is solely a contact flange, and (B) at least one of said other flange portions is solely a securing flange, (C) said contacting flange encompassing (1) a recess formed within a portion of said flange by an upper longitudinally extending wall, a downwardly extending wall at an angle to said upper longitudinally extending wall, side walls at right angles to said upper longitudinally extending wall, said walls forming a first recess, a portion of said recess extending toward the center of said body portion in the longitudinal direction and (2) forming thereby a second recess in communication with said first recess within said flange, (3) said second recess being spaced from said planar surface by a horizontally outwardly extending wall, (4) said contact means extending outwardly through the upper portion of said flange along the upper longitudinally extending wall of said first recess, thence downwardly at an acute angle to said longitudinally extending wall, said downwardly extending portion of said contact means protruding below the plane surface of said flange and then upwardly and inwardly at substantially a right angle to said downwardly extending portion, said contact means terminating within said second recess, (5) a portion of said contact means at said terminal end having inwardly sliding contact with one interior wall of said flange portion to thereby have a wiping action against the mating printed circuit board conductor on upward deformation of said spring on securement of said component to the printed circuit.

4. A printed circuit which comprises (A) an insulated panel board having thereon (1) printed conductor elements, (2) said panel board having a recess within the body thereof, (3) said printed conductor elements terminating adjacent said recess, (B) an electrical component positioned within said recess which component is comprised of (1) a body portion having formed on selected sides thereof flange portions, said flange portions having one face thereof lying substantially in a plane which passes longitudinally through the center of said body, each said flange portion having one planar face, (2) electrically conductive contact springs, selected ones of said contact springs being in contact with selected ones of said printed conductor elements, (3) said flange portions having cooperative means for securing said component on said board, (4) said flange portions being further provided with at least one continuous seal ring extending around the periphery of said flange portion and spring contact area, said seal ring being partially recessed within said flange and resiliently and compressibly held thereon, whereby said component has its center of gravity in close proximity to the plane of said panel board, the necessity of soldering said component connectors to said printed circuit conductors is obviated and foreign matter is excluded from said contact area.

5. A terminal connection for a printed electrical circuit component which comprises (A) a flange-like portion having one face thereof planar, (B) said flange-like portion encompassing a recess, (C) at least one electrically conductive contact spring recessed within said flange in said recess and a portion of said spring projecting a distance below said planar flange surface, (1) said spring being positioned within said recess in said flange and having at least one U-shaped portion and (2) having one extremity thereof extending upwardly and inwardly with respect to said flange portion, thus imparting to said contact spring a resiliency which serves to provide a wiping action on a conductor element of said printed circuit, (D) said flange being further provided with a continuous groove substantially around the periphery of said planar face, said groove having therein a resilient seal ring, said ring extending a predetermined distance below said planar face thereby excluding foreign matter from the electrical contact area.

6. A device for incorporation in a printed circuit panel which panel has at least one recess in the interior thereof, said device comprising (A) a substantially rectangular body, said body having an upper portion and a lower portion, (1) said body having flanges thereon, (2) said flanges having electrical contact means for contact with conductors of a printed circuit, (3) said flanges having in addition securement means for the reception of cooperating securing means, (4) each of said flanges having one face thereof planar, (5) said planar face lying in a plane which passes substantially longitudinally through the center of said body thereby adapting said body for recessed positioning within a recess of the printed circuit board and serving to impart to said body the capability of withstanding dynamic loads imposed by vibration and abrupt changes in acceleration while utilizing the least amount of space feasible.

7. The device of claim 6 wherein selected ones of said flanges have integral therewith guide pins for cooperation with pin receiving recesses in said board and serving to properly orient and position said device with respect to a particular circuit pattern.

8. The device as claimed in claim 6 wherein said body portion adjacent to, but spaced below said flanges a distance substantially the thickness of said circuit board is provided with keyways for the reception of securing and positioning means, said means comprising a flat key having cooperative means for reception of a portion of said device and serving to resiliently retain said device against said board.

9. The device as claimed in claim 6 wherein one end of said body is provided in its median portion with a wedge-shaped slot for the reception of an edge of said recess of the printed circuit panel.

10. A mounting and contact means for a component for incorporation in a printed circuit panel board comprising:

a rectangular flange having a planar surface and substantial thickness, said flange encompassing therein a recess, (A) said recess being defined by interior flange walls and substantially in the form of a U which U has its legs extending rearwardly and substantially parallel to the longitudinal plane of said flange, a portion of one leg of said U-shaped recess being open to the planar surface of said flange to thereby provide access from the interior of said flange to a cooperating contact surface on said printed circuit panel board, (B) a spring-like electric contact element positioned within said flange in said recess and lying substantially along the U-shaped wall defining said recess (1) said electric contact element being substantially U-shaped with the web of said U extending at an acute angle to one leg of said U, (2) the other leg of said contact element being at substantially a right angle to said web, (3) the angled portion of said U-shaped electric contact element between said web and said other leg protruding below the planar face of said flange prior to securement, (4) said second leg movable inwardly and longitudinally of said flange on contact with said printed circuit panel and serving to thereby provide a wiping action when said flange is secured to said panel.

11. A printed circuit comprising (A) an electrically insulated panel board, (B) said panel board having thereon a plurality of electrically conductive elements forming a portion of a printed circuit, (1) a rectangular recess within the peripheral confines of said board, (2) said electrically conductive elements terminating at said rectangular recess, (C) a conductor connecting component having a body of substantially rectangular shape positioned within said recess, (1) said component having an upper portion and a lower portion, (2) said component incorporating flange portions thereon, said flange portions having one face thereof planar, each of which faces lies substantially in a plane passing longitudinally through the center of said component, (3) means in at least one of said planar portions serving to receive component securing means, said component extending substantially equidistantly above and below the plane of said printed circuit panel board with said upper portion of said component extending above said panel board and the lower portion of said component extending below said panel board, (4) the planar face of each said flange portion lying on the planar surface of said board and thereby imparting to said component insensitivity to dynamic loads imposed thereon, (5) at least one of said flange portions encompassing a recess which recess is formed by a pair of side walls, a first wall extending longitudinally outwardly along the upper portion of said flange, a second wall extending from a juncture with said first wall downwardly, said recess being open at the planar flange face, (6) a groove in said flange around the peripheral portion of said planar face, (7) said groove having a deformable resilient seal element therein, said resilient seal element protruding below said planar face of said flange to thereby provide a seal when said flange portions are secured to said board, (8) electrically conductive spring contact means positioned within said flange recess, one end of said electric contact means serving to make electrical contact with circuit completing means within said component body, a first portion of said contact means extending outwardly along one wall of said component recess, another portion of said contact means extending downwardly and inwardly at an acute angle to an adjacent portion of said means, said last named portion extending below the planar face of said flange through the open portion thereof, a third portion extending upwardly and inwardly from said last named portion, said third portion extending into and terminating within said secondary recess, said second and third portions of said spring-like contact means deforming upwardly and inwardly on securement of said component to said printed circuit panel board by said securement means and thus serving to achieve a wiping action between the contact portion of the electric contact means and the terminal portion of said circuit board electrically conductive element.

12. In a printed circuit having an insulating panel board with a rectangular recess interiorly thereof and electrically conductive printed circuit means thereon, the improvement which comprises:

a component for insertion in said circuit having means thereon serving to position said component so that the plane of the board passes substantially through the center of gravity of said component when said element is in operative relationship to said board, said positioning means incorporating (1) a recess having cooperative means for receiving a fastener means, (2) spring means serving to establish electrical contact with the printed circuit on securement of said component thereto, and (3) means serving to seal said spring means from the surrounding environment on securement of said component.

13. The device of claim 12 wherein said positioning means comprises at least one flange-like portion having a planar face coincident with a plane passing substantially through the center of said element.

14. The device of claim 13, said electric contact means comprising a spring-like element having one portion thereof substantially U-shaped, said element recessed within said flange-like portion and projecting below said planar face, said U-shaped spring-like element being free to move at one end thereof longitudinally and serving to cause a wiping action on securement of said flange-like portion in operative relation to the electrically conductive printed circuit means.

15. The device of claim 14 wherein said sealing means comprises a recessed portion extending around the peripheral portion of said planar face, said recessed portion having positioned therein a compressibly resilient element which protrudes below the plane of said flange-like portion to thereby form a seal around said contact element on the attachment of said flange to said board.

16. A base member adapted to be mounted on an electrically insulating panel having a plurality of electrical conductors on the surface thereof comprising:

(a) a body having a planar seating surface adapted for seating on the surface of an insulating panel;

(b) said seating surface having a plurality of recesses therein;

(c) said body having a mating surface opposite said seating surface adapted for receiving and mating with an electrical component;

(d) said body incorporating a plurality of electrical conducting elements;

(e) a portion of each of said conducting elements projecting respectively from said recesses outwardly of said body beyond said planar seating surface and adapted for contacting electrical conductors on an insulating panel;

(f) a portion of each of said conducting elements projecting outwardly of said body beyond said mating surface and adapted for being electrically connected to an electrical component received by said base member;

(g) said portions projecting outwardly of said body beyond said planar seating surface being resiliently suppressible on contacting electrical conductors on an insulating panel to a position substantially coplanar with said seating surface.

17. A base member as defined in claim 16 including threaded means for fastening said base member to an insulating panel.

References Cited by the Examiner

UNITED STATES PATENTS

| | | | |
|---|---|---|---|
| 2,970,244 | 1/61 | Beverly et al. | 317—101 |
| 3,061,816 | 9/62 | Reynolds | 317—99 |

KATHLEEN H. CLAFFY, *Primary Examiner.*

JOHN F. BURNS, *Examiner.*